(12) United States Patent
Kamitani et al.

(10) Patent No.: US 6,518,777 B2
(45) Date of Patent: Feb. 11, 2003

(54) METHOD AND APPARATUS FOR MEASURING INSULATION RESISTANCE

(75) Inventors: Gaku Kamitani, Otsu (JP); Akihiro Hayashi, Shiga-ken (JP); Koichi Teramura, Shiga-ken (JP)

(73) Assignee: Murata Manufacturing Co., Ltd., Nagaokakyo (JP)

( * ) Notice: Subject to any disclaimer, the term of this patent is extended or adjusted under 35 U.S.C. 154(b) by 0 days.

(21) Appl. No.: 09/739,108

(22) Filed: Dec. 19, 2000

(65) Prior Publication Data

US 2001/0015647 A1 Aug. 23, 2001

(30) Foreign Application Priority Data

Dec. 20, 1999 (JP) ............................................ 11-360296

(51) Int. Cl.[7] .......................... G01R 27/28; G01R 31/12

(52) U.S. Cl. ....................... 324/678; 324/548; 324/659; 324/658; 324/677

(58) Field of Search ................................. 324/678, 548, 324/659, 658, 677

(56) References Cited

U.S. PATENT DOCUMENTS

| | | | | |
|---|---|---|---|---|
| 4,646,248 A | * | 2/1987 | Reynolds | 364/483 |
| 4,841,228 A | * | 6/1989 | Noguchi et al. | 324/62 |
| 4,931,721 A | * | 6/1990 | Berrigan et al. | 324/658 |
| 5,325,068 A | * | 6/1994 | Rauf | 324/713 |
| 5,510,719 A | * | 4/1996 | Yamamoto | 324/548 |
| 5,677,634 A | * | 10/1997 | Cooke et al. | 324/548 |
| 5,880,589 A | * | 3/1999 | Okano | 324/548 |
| 6,043,665 A | * | 3/2000 | Nishioka et al. | 324/678 |
| 6,191,723 B1 | * | 2/2001 | Lewis | 341/166 |
| 6,275,047 B1 | * | 8/2001 | Zoellick et al. | 324/678 |

FOREIGN PATENT DOCUMENTS

| | | | |
|---|---|---|---|
| EP | 0 789 248 | 8/1977 | |
| EP | 0 789 248 A2 | * 8/1997 | ........... G01R/31/12 |
| GB | 2272777 | 5/1994 | |
| JP | 5-64782 | 8/1993 | |
| JP | 407063813 A | * 3/1995 | ........... G01R/31/08 |
| JP | 9-196981 | 7/1997 | |
| JP | 362272127 A | * 11/1997 | .......... G01H/17/00 |
| JP | 11044715 | 2/1999 | |
| JP | 411044715 A | * 2/1999 | ........... G01R/27/02 |
| WO | WO 93/00591 | * 1/1993 | |

OTHER PUBLICATIONS

The IEEE Standard Dictionary Of Electrical and Electronics terms, sixth Edition Apr. 8, 1997 (p. 707).*
Newton's Telecom Dictionary 1998 p. 531.*

* cited by examiner

*Primary Examiner*—N. Le
*Assistant Examiner*—Wasseem Hamdan
(74) *Attorney, Agent, or Firm*—Burns, Doane, Swecker & Mathis, LLP

(57) ABSTRACT

A method and an apparatus for measuring insulation resistance capable of removing the influences of piezoelectric noise which is occurring due to mechanical vibrations applied to an electronic component to measure the insulation resistance of the electronic component with high accuracy. In order to do so, a predetermined measured voltage is applied to the electronic component arranged in a position subjected to periodic mechanical vibrations from the outside to measure a current flowing through the electronic component. Then, the value of the measured current flowing through the electronic component is integrated over the period of the mechanical vibrations or over a time which is an integral multiple thereof. With this arrangement, a piezoelectric noise current can be cancelled and only a leakage current to be primarily measured can be extracted. Thus, by calculating the value of the insulation resistance from the value of the current, the insulation resistance can be detected with high accuracy.

8 Claims, 4 Drawing Sheets

INTEGRATION TIME

METHOD AND APPARATUS FOR MEASURING INSULATION RESISTANCE

BACKGROUND OF THE INVENTION

1. Field of the Invention

The present invention relates to a method and a apparatus for measuring the insulation resistance of an electronic component. Particularly, the invention relates to a method for removing the influences of noise due to mechanical vibrations occurring in equipment for checking the characteristics of an electronic component having the piezoelectric effect.

2. Description of the Related Art

Conventionally, a measuring circuit is used to measure the insulation resistance of an electronic component such as a ceramic capacitor. FIG. 1 shows the conventional measuring circuit using a current voltage conversion system. Reference character Rs denotes an inrush current limit resistance of an electronic component 1 as a tested sample, and reference character Rx denotes the insulation resistance of the electronic component 1. The value of Rs is much smaller than the value of Rx. A ceramic capacitor is usually shown by a parallel equivalent circuit composed of the insulation resistance Rx and a capacitance. In this figure, however, only the insulation resistance Rx is provided to simplify the illustration. Reference numeral 2 denotes an operational amplifier having a feedback resistance Rf. In the circumstances, a current i flowing to the electronic component 1 from the output Vo of the operational amplifier 2 is obtained. Then, with a power supply voltage E and the current i, the insulation resistance Rx of the electronic component 1 can be obtained by the following equations.

$$i = Vo/Rf$$

$$Rx = E/i$$

In this method, the leakage current i is extremely small and there is susceptibility to the influences of noise, although control is simple and a quickly response can be obtained.

In addition, as shown in FIG. 2, there is an insulation resistance measuring circuit using an electric charge accumulating system. One example is described in Japanese Unexamined Utility Model Publication No. 5-064782. In this measuring circuit, a switch SW and a feedback capacitance Cf are connected in parallel between the inverting input terminal of an operational amplifier 2 as a high input impedance amplifier and the output terminal thereof. The switch SW is turned from ON to OFF to measure an output Vo after t seconds. The value of t is, for example, set to be a desired value of approximately 0.1 to 10 seconds. Then, a current i flowing through an electronic component 1 from the output Vo is obtained-by the following equations. In addition, with a power supply voltage E and the current i, the insulation resistance Rx of the electronic component 1 is obtained.

$$i = Cf \cdot Vo/t$$

$$Rx = E/i$$

Since the electric charge accumulating circuit serves as an integrator, the circuit can reduce the influences of hums due to a commercial power supply and the like.

When stress is applied to a dielectric member in a situation in which a DC voltage is applied, the piezoelectric effect permits an electric charge according to the stress to be generated from the dielectric member. In general, in apparatuses for checking the characteristics of electronic components, there are used many devices such as a part feeder, a motor, and a hopper, which produce mechanical vibrations due to driving. With the propagation of the vibrations through an electronic component, a noise current due to the piezoelectric effect is generated. However, as mentioned above, a leakage current i, which is measured to obtain the insulation resistance of the electronic component 1, is extremely small. In addition, a piezoelectric noise current occurring due to mechanical vibrations applied to the electronic component 1 is superimposed on the measured current i to make a measurement error.

As a result, the former measuring circuit using the current voltage transformation system cannot remove the influences of noise. In addition, the latter measuring circuit using the electric charge accumulating system cannot remove the influence of the above-mentioned piezoelectric noise current, either.

SUMMARY OF THE INVENTION

Accordingly, it is an object of the present invention to provide an insulation resistance measuring method, which can remove the influences of piezoelectric noise due to mechanical vibrations applied to an electronic component and can measure the insulation resistance of the electronic component with high accuracy.

In order to accomplish the above object, according to a first aspect of the present invention, there is provided an insulation resistance measuring method including the steps of applying a predetermined measurement voltage to an electronic component arranged in a position subjected to periodic mechanical vibrations from the outside, measuring a current flowing through the electronic component, and integrating the value of the measured current flowing through the electronic component over the period of the mechanical vibrations or over a time which is an integral multiple of the period thereof to obtain the insulation resistance of the electronic component.

According to a second aspect of the present invention, there is provided an insulation resistance measuring method including the steps of applying a predetermined measured voltage to an electronic component arranged in a position subjected to periodic mechanical vibrations from the outside, measuring a current flowing through the electronic component, and integrating the value of the measured current flowing through the electronic component over a time which is the least common multiple of the period of the mechanical vibrations and the period of a commercial power supply to obtain the insulation resistance of the electronic component.

According to a third aspect of the invention, there is provided an insulation resistance measuring method including the steps of applying a predetermined measured voltage to an electronic component arranged in a position subjected to periodic mechanical vibrations from the outside, measuring a current flowing through the electronic component, in which the period of the mechanical vibrations is equal to or less than ½ of the period of a commercial power supply, integrating the value of the measured current flowing through the electronic component over the period of the mechanical vibrations, integrating the value of the measured current flowing through the electronic component over the period of the mechanical vibrations after a time which is ½ of the period of the commercial power supply has passed from the onset of the above integration, and obtaining the average of the results from the two integrations.

According to a fourth aspect of the present invention, there is provided an insulation resistance measuring method including the steps of applying a predetermined measurement voltage to an electronic component arranged in a position subjected to periodic mechanical vibrations from the outside, measuring a current flowing through the electronic component, in which the period of a commercial power supply is equal to or less than ½ of the period of the mechanical vibrations, integrating the value of the measured current flowing through the electronic component over the period of the commercial power supply, integrating the value of the measured current flowing through the electronic component over the period of the commercial power supply after a time which is ½ of the period of the mechanical vibrations has passed from the onset of the integration, and obtaining the average of the results from the two integrations.

According to a fifth aspect of the present invention, there is provided an insulation resistance measuring apparatus including a DC measurement power supply, an electronic component arranged in a position subjected to periodic mechanical vibrations from the outside, and an electric charge accumulating circuit for integrating an input current i to obtain a voltage output Vo so as to obtain the insulation resistance of the electronic component. The DC measurement power supply, the electronic component, and the electric charge accumulating circuit are connected in series to each other. In this apparatus, the integration time of the input current i is set to be the period of the mechanical vibrations or a time which is an integral multiple thereof.

According to a sixth aspect of the present invention, there is provided an insulation resistance measuring apparatus including a DC measurement power supply, an electronic component arranged in a position subjected to periodic mechanical vibrations from the outside, and an electric charge accumulating circuit for integrating an input current i to obtain a voltage output Vo so as to obtain the insulation resistance of the electronic component. The DC measurement power supply, the electronic component, and the electric charge accumulating circuit are connected in series to each other. In this apparatus, the integration time of the input current i is set to be a time which is the least common multiple of the period of the mechanical vibrations and the period of a commercial power supply.

In the insulation resistance measuring method according to the invention, the measurement voltage is applied to the electronic component to measure the current. When the vibrations due to a drive mechanism and the like propagate through the electronic component, a piezoelectric noise current is generated. The piezoelectric noise current has a periodicity in accordance with the vibration frequency of the drive mechanism. A current obtained by superimposing a leakage current to be primarily measured on the piezoelectric noise current is measured. The vibration frequency of the drive mechanism is in advance measured and the value of a measured current flowing through the electronic component is integrated over the period of the mechanical vibrations. With this arrangement, since the piezoelectric noise current is cancelled, only the leakage current to be primarily measured can be extracted. With a calculation based on the current value, the insulation resistance of the electronic component can be detected with high accuracy.

In terms of the integration time, even when integration is performed not only over the period of the mechanical vibrations but also over a time which is the integral multiple thereof, the same result can be obtained.

This method can be used if only the piezoelectric noise has the periodicity, even though the noise has a distorted waveform.

When the noise applied to the electronic component comes from only the vibrations due to a single drive mechanism, the signal of the piezoelectric noise can be effectively removed by integrating over the period of the mechanical vibrations. Meanwhile, when noises caused by the vibrations due to a plurality of drive mechanisms are combined, by integrating over a time which is the least common multiple of the vibration periods of the drive mechanisms, the plurality of piezoelectric noise currents can be simultaneously removed. As a result, only a leakage current to be primarily measured can be extracted. For example, when the vibration frequency of a first drive mechanism is 120 Hz and the vibration frequency of a second drive mechanism is 240 Hz, by integrating over the period of the least common multiple (¹⁄₁₂₀=8.3 msec), the two piezoelectric noise currents can be simultaneously removed.

When the noises applied to the electronic component are produced by the combination of the mechanical vibrations due to the drive mechanism and hums due to a commercial power supply, as described above, the combined noise current can be integrated over the period of the least common multiple of the period of the mechanical vibrations and the period of the commercial power supply. For example, when the frequency of the commercial power supply is 60 Hz and the vibration frequency of the drive mechanism is 120 Hz, a measurement apparatus detects, in addition to a leakage current to be primarily measured, a superimposed form of the hum current from the commercial power supply and the piezoelectric noise currents from the drive mechanism. When the current formed by superimposing is integrated over the commercial power-supply period (¹⁄₆₀=16.7 msec), which is the period of the least common multiple, the hum current and the piezoelectric noise current can be simultaneously removed. Thus, only the leakage current to be primarily measured can be extracted.

This method can be used if only each of the piezoelectric noise and the hum has a periodicity, even though the noises have distorted waveforms.

As described above, preferably, the drive mechanism is designed in advance in such a manner that the frequency of the mechanical vibrations is set to be an integral multiple of the frequency of the commercial power supply or the reciprocal of the integral multiple thereof. With this arrangement, the longest one of the periods of the mechanical vibrations and the period of the commercial power supply is used for integration. Thus, the integration time is not increased.

As described above, both noises can be simultaneously removed by integrating over the period of the least common multiple of the period of the mechanical vibrations and the period of the commercial power supply. However, there is a problem in that the integration time is increased. Thus, when the period of the mechanical vibrations is equal to or less than ½ of the period of the commercial power supply, the noises can be removed by the method according to the third aspect of the invention. As a result, the integration time can be shortened. In other words, first, the measured current value is integrated over the period of the mechanical vibrations. Then, after a time which is ½ of the period of the commercial power supply has passed from the onset of integration, the measured current value is again integrated over the period of the mechanical vibrations. Thus, only a leakage current to be primarily measured can be extracted by the average of the results from the two integrations.

This method can be applied when the frequency of the mechanical vibrations is higher than the frequency of the commercial power supply. In addition, there is an advantage when hums have normal sine waves, which are not distorted.

In contrast with the above case, when the period of the commercial power supply is equal to or less than ½ of the period of the mechanical vibrations, noises can be removed by the method according to the fourth aspect of the invention. As a result, the integration time can be shortened. In other words, first, the measured current value is integrated over the period of the commercial power supply. Then, after a time which is ½ of the period of the mechanical vibrations has passed from the onset of integration, the measured current value is again integrated over the period of the commercial power supply. After this, only a leakage current to be primarily measured can be extracted by the average of the results from the two integrations.

This method can be applied when the frequency of the commercial power supply is higher than the frequency of the mechanical vibrations. In addition, there is an advantage when hums have normal sine waves, which are not distorted.

In the measuring apparatus according to the fifth aspect of the invention, the above method of the first aspect of the invention is applied to the circuit using the electric charge accumulating system. In the measuring apparatus according to the sixth aspect of the invention, the method of the'second aspect of the invention is applied to the circuit using the electric charge accumulating system.

DESCRIPTION OF THE PREFERRED EMBODIMENTS

Figure 3:
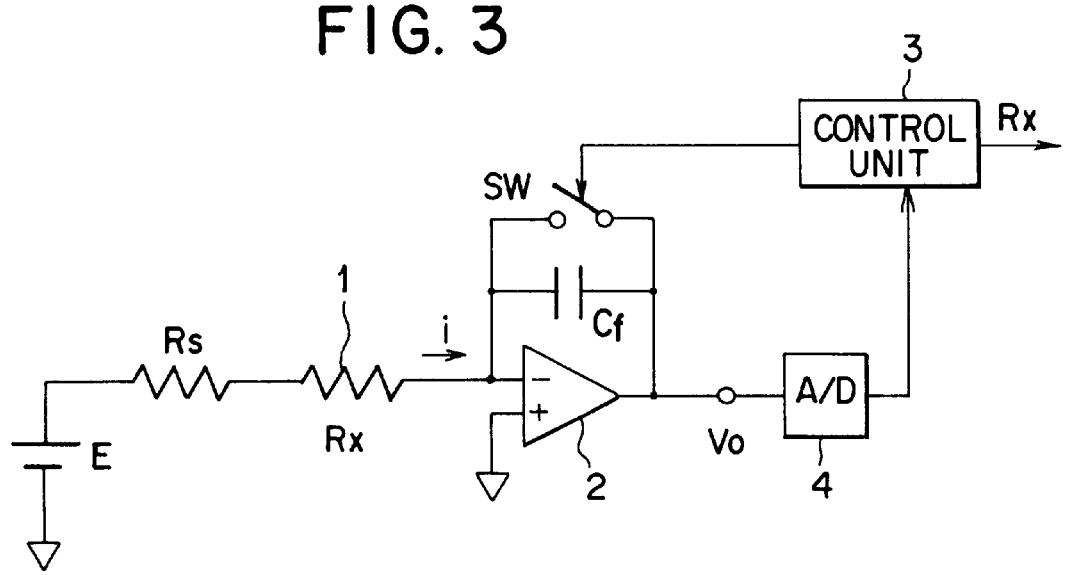
FIG. 3 is a circuit diagram of an insulation resistance measuring apparatus according to a first embodiment of the present invention.

FIG. 3 shows an insulation resistance measuring apparatus according to a first embodiment of the present invention.

Figure 1:
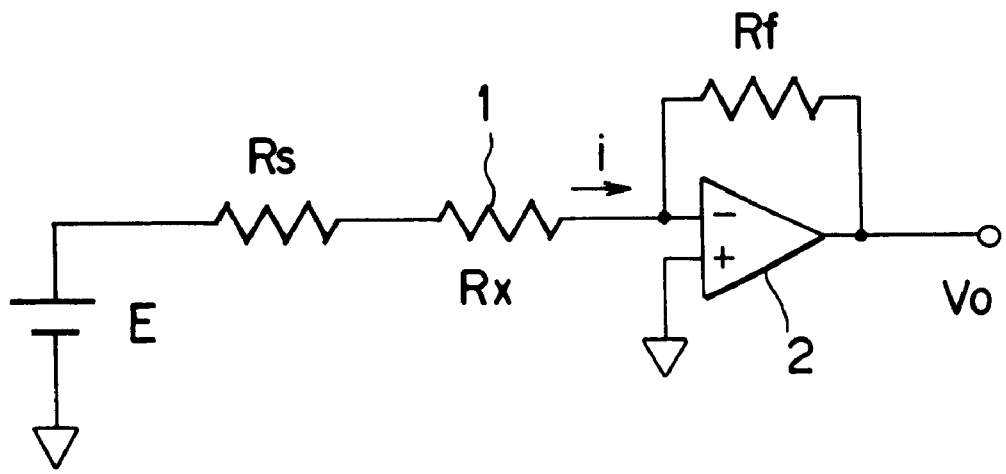
FIG. 1 is a circuit diagram of an example of a conventional insulation resistance measuring apparatus.
Figure 2:
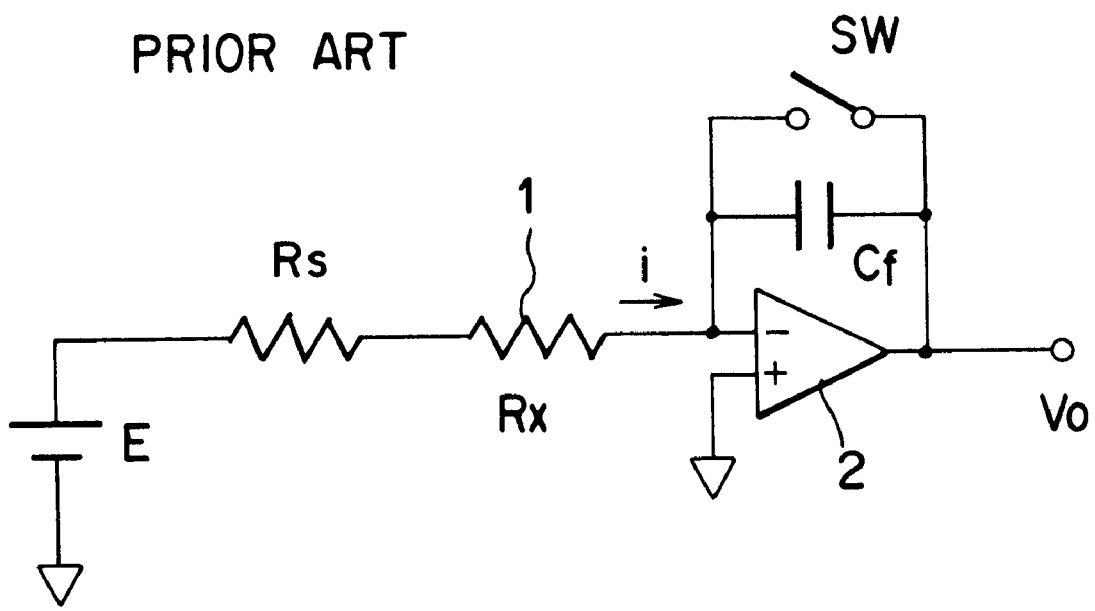
FIG. 2 is a circuit diagram of another example of the conventional insulation resistance measuring apparatus.

The insulation resistance measuring apparatus is a measuring circuit of the same electric charge accumulation system as that shown in FIG. 2. Reference numeral 1 denotes an electrical component using a dielectric member such as a ceramic capacitor. Reference numeral 2 denotes an operational amplifier as a high input impedance amplifier. Reference character Cf a feedback capacitance connected between the inverting input terminal of the operational amplifier 2 and the output terminal thereof. Reference character SW denotes a switch connected in parallel to the feedback capacitance Cf. An electric charge accumulating circuit is formed by the operational amplifier 2 and the feedback capacitance Cf. A current i flowing through the electronic component 1 is integrated to obtain a voltage output Vo. Reference character E denotes a power supply voltage, and reference character Rs denotes an entry current limit resistance of the electronic component 1. Reference character Rx denotes the insulation resistance of the electronic component 1. The value of Rs is much smaller than the value of Rx.

Turning ON/OFF of the switch SW is controlled by control unit 3. The control unit 3 is connected to the output terminal of the operational amplifier 2 via an A/D converter 4. The control unit 3 turns the switch SW from ON to OFF to measure the output Vo after t seconds. Then, by the following equations, the value of current i flowing through the electronic component 1 from the output Vo is obtained, and the insulation resistance Rx of the electronic component 1 is obtained based on the power supply voltage E and the current i.

$$i = Cf \cdot Vo/t \quad (1)$$

$$Rx = E/i \quad (2)$$

The insulation resistance measuring apparatus is disposed as a part of equipment for checking the characteristics of the electronic component 1. The insulation resistance measuring apparatus is arranged near a drive mechanism generating mechanical vibrations, such as a part feeder, a motor, a hopper, or the like. Thus, the mechanical vibrations propagate through the electronic component 1, by which a noise current due to the piezoelectric effect occurs. The piezoelectric noise current is superimposed on the current i to be primarily measured, with the result that a measurement error is caused.

Figure 4A:
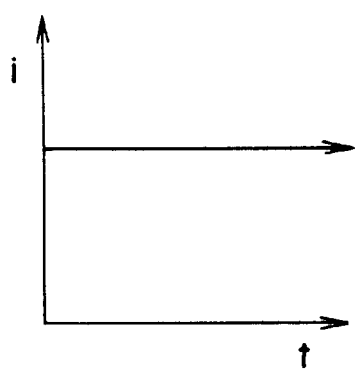
FIGS. 4A to 4D show the graphs of current waveforms of an insulation resistance measuring method according to the first embodiment of the present invention.
Figure 4B:
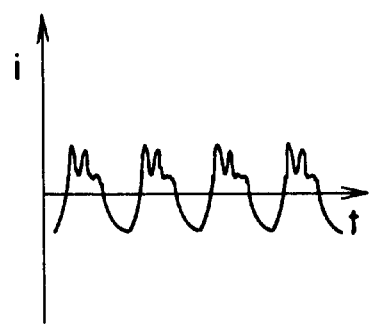
Figure 4C:
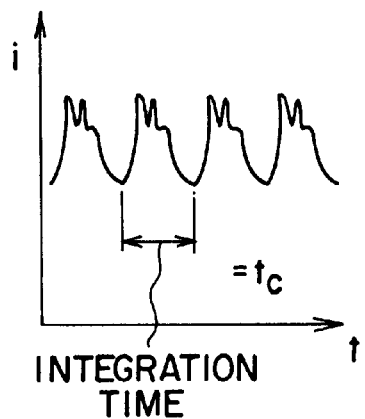

FIG. 4A shows a leakage current i flowing through the electronic component 1. The current i is a current to be primarily measured. FIG. 4B shows a piezoelectric noise current having a periodicity in accordance with the vibration frequency of the drive mechanism. FIG. 4C shows a superimposed form of the leakage current i and the piezoelectric noise current. The signal of the superimposed form of both currents is observed. When the vibration frequency of the drive mechanism is 200 Hz, the period of the vibration frequency is ¹⁄₂₀₀ (5 msec). The control unit 3 sets a time t for turning the switch SW from ON to OFF to measure an output Vo according to the period. That is, the current flowing through the electronic component 1 is integrated over the period of the mechanical vibrations, which is equivalent to tc (5 msec).

Figure 4D:
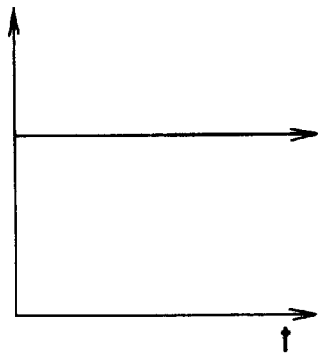

The current i obtained by the above method is shown in FIG. 4D, and can be gained at intervals of 5 msec. This is the same as the current obtained at intervals of 5 msec by sampling the current i shown in FIG. 4A. As a result, this is a smoothed current subjected to no influence of the piezoelectric noise current. Therefore, in the equation (2), since the insulation resistance Rx is obtained based on the current i, the insulation resistance can be measured with high accuracy.

In this case, the integration time t may be the period tc of the mechanical vibrations. Alternatively, the time t may be an integral multiple of the period tc to obtain the same result. In order to make the integration time as short as possible, as shown in the first embodiment, it is preferable that the integration time is equal to the period of the mechanical vibrations.

FIGS. 5A to 5E show currents relating to an insulation resistance measuring method according to a second embodiment of the present invention.

In this embodiment, noises given to an electronic component 1 are the combination of the mechanical vibrations due to a drive mechanism and hums due to a commercial power supply. The measuring apparatus used in this embodiment is the same as that shown in FIG. 3.

Figure 5A:
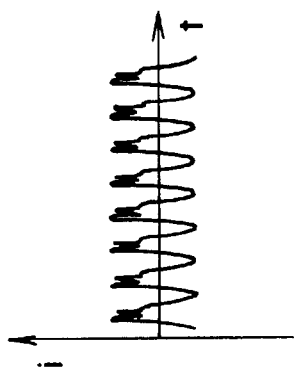
FIGS. 5A to 5F show the graphs of current waveforms of an insulation resistance measuring method according to a second embodiment of The present invention.
Figure 5B:
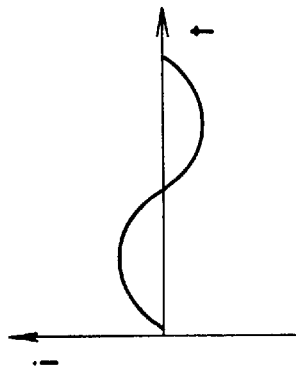
Figure 5C:
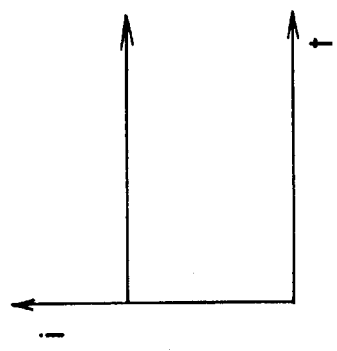
Figure 5D:
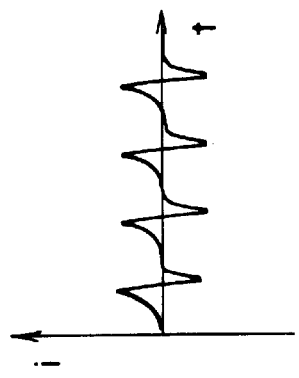
Figure 5E:
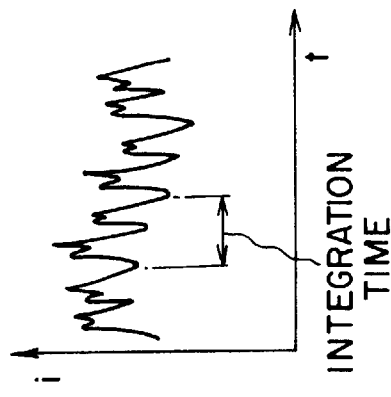

FIG. 5A shows a leakage current flowing through the electronic component 1. The current is a current to be primarily measured. FIG. 5B shows a piezoelectric noise current due to a first drive mechanism such as a part feeder. FIG. 5C shows a piezoelectric noise current due to a second drive mechanism such as a motor. FIG. 5D shows a hum current due to a commercial power supply. FIG. 5E shows the superimposed form of the leakage current, the piezoelectric noise current, and the hum current. The signal of the superimposed form of the currents is observed.

In this case, a time t from turning ON/OFF of the switch SW to measure an output Vo is set to be the least common multiple of the period of the mechanical vibrations and the period of the commercial power supply. In other words, the current flowing through the electronic component 1 is integrated over a time which is the least common multiple of the period of the mechanical vibrations and the period of the commercial power supply.

For example, when the vibration frequency of the first drive mechanism is 240 Hz, the vibration frequency of the second drive mechanism is 120 Hz, and the frequency of the commercial power supply is 60 Hz, the least common multiple of these periods is obtained by an equation $\frac{1}{60}=16.7$ msec. As a result, the switch SW is turned from ON to OFF to measure an output Vo after 16.7 msec as the time t. Then, the current i is obtained from the output Vo by the equation (1).

Figure 5F:
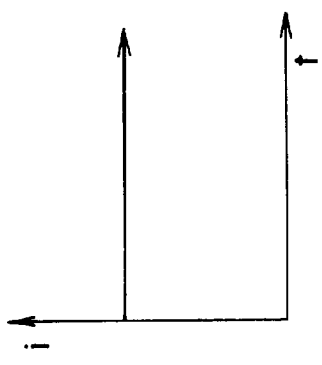

The obtained current i is shown in FIG. 5F, and the current i can be obtained at intervals of 16.7 msec. This is the same as the current obtained at intervals of 16.7 msec by sampling the current i shown in FIG. 5A. The current is a smoothed current subjected to no influences of the piezoelectric noise current and the hum current. As a result, based on the current i, as in the equation (2), an insulation resistance Rx can be obtained, by which the insulation resistance can be measured with high accuracy.

As described in the above embodiment, preferably, each of the drive mechanisms is manufactured in advanced in such a manner that the frequency of the mechanical vibrations is set to be an integral multiple of the frequency of the commercial power supply or the reciprocal of the integral multiple thereof. With this arrangement, the longest one of the periods of the mechanical vibrations and the period of the commercial power supply can be used for integration. Thus, the integration time can be shortened.

FIGS. 6A to 6E shows currents relating to an insulation resistance measuring method according to a third embodiment of the present invention.

In this embodiment, a noise given to an electronic component 1 is the combination of mechanical vibrations due to a drive mechanism and hums due to a commercial power supply. In addition, the period of the mechanical vibrations is equal to or less than ½ of the period of the commercial power supply.

Figure 6A:
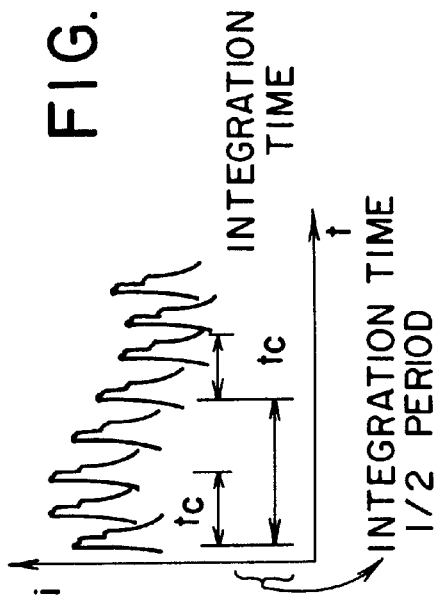
FIGS. 6A to 6E show the graphs of current waveforms of an insulation resistance measuring method according to a third embodiment of the present invention.
Figure 6B:
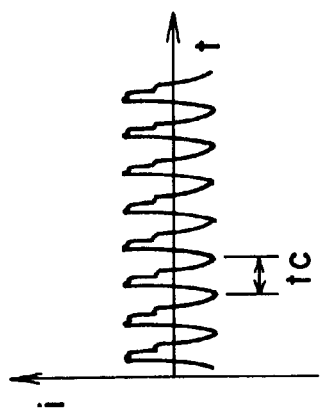
Figure 6C:
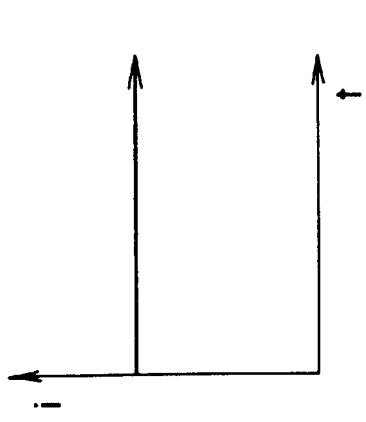
Figure 6D:
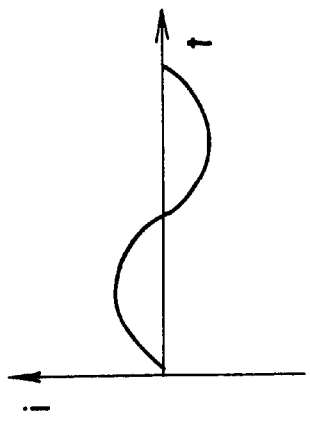

FIG. 6A shows a leakage current flowing through an electronic component 1. The current is a current to be primarily measured. FIG. 6B shows a piezoelectric noise current due to a drive mechanism. FIG. 6C shows a hum current due to a commercial power supply. FIG. 6D shows the superimposed form of the leakage current, the piezoelectric noise current, and the hum current. The signal of the superimposed form of the currents is observed.

As in the second embodiment, in order to integrate a measured current value, it is possible to use the least common multiple of the period of the mechanical vibrations and the period of the commercial power supply. However, the integration time is increased. For example, when the frequency of the commercial power supply is set to be 60 Hz and the frequency of the mechanical vibrations is set to be 200 Hz, the integration time is 83.5 msec.

In this embodiment, however, the measured current value is first integrated over the shorter period of them (the period of the mechanical vibrations). Then, after a time which is ½ of the longer period of them (the period of the commercial power supply) has passed from the onset of the integration, the measured current value is again integrated over the shorter period (the period of the mechanical vibrations). As a result, the average of the two integrations is obtained, by which only a leakage current to be primarily measured is extracted.

Figure 6E:
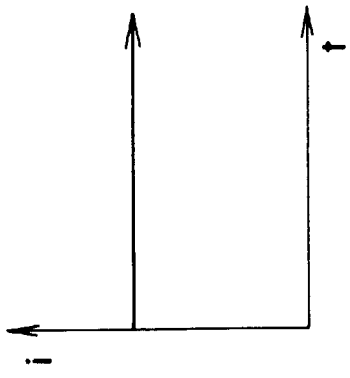

For example, when the frequency of the commercial power supply is set to be 60 Hz and the frequency of the mechanical vibrations is set to be 200 Hz, first, the measured current value is integrated over the period ($\frac{1}{200}=5$ msec) of the mechanical vibrations. After a time ($\frac{1}{60}\times2=8.3$ msec) which is ½ of the period of the commercial power supply has passed from the onset of a first integration, the measured current value is again integrated over the period ($\frac{1}{200}=5$ msec) of the mechanical vibrations. When the average of the two integrations is obtained, the noise components are canceled to be zero. Thus, as shown in FIG. 6E, only a leakage current to be measured can be detected at intervals of 13.3 msec (5+8.3). In other words, the obtained current is the same as the current obtained by sampling the current shown in FIG. 6A at intervals of 13.3 msec.

With this method, the integration time is only 13.3 msec. Thus, this is much shorter than the case of the least common multiple (83.5 msec).

In the third embodiment, the noise applied to the electronic component 1 is the combination of the mechanical vibrations due to the drive mechanism and hums due to the commercial power supply. In addition, the period of the mechanical vibrations is equal to or less than ½ of the period of the commercial power supply. In contrast, when the period of the commercial power supply is equal to or less than the period of the mechanical vibration, a method opposing the above method can be used to perform the measurement.

In other words, first, the measured current value is integrated over the period of the commercial power supply. Then, after a time which is ½ of the period of the mechanical vibrations has passed from the onset of the integration, again, the measured current value is integrated over the period of the commercial power supply. Thus, only a leakage current to be primarily measured can be extracted by the average of the results from the two integrations.

Besides a ceramic capacitor, the present invention can be applied to any other electronic component having the piezoelectric effect.

As described above, according to the present invention, the value of a measured current flowing through an electronic component is integrated over the period of mechanical vibrations or the period of an integral multiple thereof, whereby the influence of a piezoelectric noise occurring due to the propagation of the mechanical vibrations through the electronic component is reduced. As a result, the insulation resistance of the electronic component can be obtained with high accuracy.

In addition, when the piezoelectric noise due to the mechanical vibrations and hums due to a commercial power supply are combined to be applied to the electronic component, the current value is integrated over a time which is the least common multiple of the period of the mechanical vibrations and the period of the commercial power supply.

As a result, the influences of these noises can be reduced, and the insulation resistance of the electronic component can be obtained with high accuracy.

Furthermore, in the case of the combination of the piezoelectric noise and the hums described above, when the period of the mechanical vibrations is set to be equal to or less than ½ of the period of the commercial power supply, the current is integrated over the period of the mechanical vibrations, and again is integrated over the period of the mechanical vibrations after a time which is ½ of the period of the commercial power supply has passed from the onset of the integration to obtain the average of the results from the two integrations. In contrast, when the period of the commercial power supply is set to be equal to or less than ½ of the period of the mechanical vibrations, the current is integrated over the period of the commercial power supply, and again, is integrated over the period of the commercial power supply after a time which is ½ of the period of the mechanical vibrations has passed from the onset of the integration to obtain the average of the results from the two integrations. With these arrangement, the influence of noise can be reduced and the insulation resistance of the electronic component can be obtained with high accuracy. In addition, the integration time can be shortened.

While the preferred embodiments of the present invention have been described above, it will be obvious to those skilled in the art that various changes and modifications may be made without departing from the spirit or scope of the following claims.

What is claimed is:

1. An insulation resistance measuring method comprising the steps of:
   applying a predetermined measurement voltage to an electronic component arranged in a position subjected to periodic mechanical vibrations from the outside;
   measuring a current flowing through the electronic component; and
   integrating the value of the measured current flowing through the electronic component over the period of the mechanical vibrations or over a time which is an integral multiple of the period thereof to obtain the insulation resistance of the electronic component.

2. An insulation resistance measuring method comprising the steps of:
   applying a predetermined measurement voltage to an electronic component arranged in a position subjected to periodic mechanical vibrations from the outside;
   measuring a current flowing through the electronic component; and
   integrating the value of the measured current flowing through the electronic component over a time which is the least common multiple of the period of the mechanical vibrations and the period of a commercial power supply to obtain the insulation resistance of the electronic component.

3. An insulation resistance measuring method according to claim 2, wherein the frequency of the mechanical vibrations is set to be an integral multiple of the frequency of the commercial power supply or the reciprocal of the integral multiple thereof.

4. An insulation resistance measuring method comprising the steps of:
   applying a predetermined measurement voltage to an electronic component arranged in a position subjected to periodic mechanical vibrations from the outside, wherein the period of the mechanical vibrations is equal to or less than ½ of the period of a commercial power supply;
   measuring a current flowing through the electronic component;
   integrating the value of the measured current flowing through the electronic component over the period of the mechanical vibrations;
   integrating the value of the measured current flowing through the electronic component over the period of the mechanical vibrations after a time which is ½ of the period of the commercial power supply has passed from the onset of the above integration; and
   obtaining the average of the results from the above two integrations.

5. An insulation resistance measuring method comprising the steps of:
   applying a predetermined measurement voltage to an electronic component arranged in a position subjected to periodic mechanical vibrations from the outside, wherein the period of a commercial power supply is equal to or less than ½ of the period of the mechanical vibrations;
   measuring a current flowing through the electronic component;
   integrating the value of the measured current flowing through the electronic component over the period of the commercial power supply;
   integrating the value of the measured current flowing through the electronic component over the period of the commercial power supply after a time which is ½ of the period of the mechanical vibrations has passed from the onset of the above integration; and
   obtaining the average of the results from the above two integrations.

6. An insulation resistance measuring apparatus comprising:
   a DC measurement power supply;
   an electronic component arranged in a position subjected to periodic mechanical vibrations from the outside; and
   an electric charge accumulating circuit for integrating an input current i to obtain a voltage output Vo so as to obtain the insulation resistance of the electronic component, the DC measurement power supply, the electronic component, and the electric charge accumulating circuit being connected in series to each other;
   wherein the integration time of the input current i is set to be the period of the mechanical vibrations or a time which is an integral multiple thereof.

7. An insulation resistance measuring apparatus comprising:
   a DC measurement power supply;
   an electronic component arranged in a position subjected to periodic mechanical vibrations from the outside; and
   an electric charge accumulating circuit for integrating an input current i to obtain a voltage output Vo so as to obtain the insulation resistance of the electronic component, the DC measurement power supply, the electronic component, and the electric charge accumulating circuit being connected in series to each other;
   wherein the integration time of the input current i is set to be a time which is the least common multiple of the period of the mechanical vibrations and the period of a commercial power supply.

8. An insulation resistance measuring apparatus according to claim 7, wherein the frequency of the mechanical vibrations is set to be an integral multiple of the frequency of the commercial power supply or the reciprocal of the integral multiple thereof.

* * * * *